(12) United States Patent
Hirata et al.

(10) Patent No.: US 12,362,155 B2
(45) Date of Patent: Jul. 15, 2025

(54) SUBSTRATE PROCESSING APPARATUS, TEMPERATURE CONTROL METHOD OF SUBSTRATE PROCESSING APPARATUS, AND PROGRAM OF CONTROL DEVICE FOR CONTROLLING SUBSTRATE PROCESSING APPARATUS

(71) Applicant: TOKYO ELECTRON LIMITED, Tokyo (JP)

(72) Inventors: Toshiharu Hirata, Yamanashi (JP); Manabu Nakagawasai, Tokyo (JP); Takashi Ishii, Tokyo (JP); Keiichi Iobe, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 577 days.

(21) Appl. No.: 17/553,112

(22) Filed: Dec. 16, 2021

(65) Prior Publication Data

US 2022/0199377 A1    Jun. 23, 2022

(30) Foreign Application Priority Data

Dec. 22, 2020 (JP) .................................. 2020-212940

(51) Int. Cl.
*C23C 14/50* (2006.01)
*C23C 14/54* (2006.01)
(Continued)

(52) U.S. Cl.
CPC ........ *H01J 37/32724* (2013.01); *C23C 14/50* (2013.01); *C23C 14/541* (2013.01);
(Continued)

(58) Field of Classification Search
CPC ........ H01J 37/32724; H01J 2237/2001; H01J 37/34; H01J 2237/332; C23C 14/50;
(Continued)

(56) References Cited

U.S. PATENT DOCUMENTS 5,567,267 A * 10/1996 Kazama ................. H01J 37/32
118/724
5,676,205 A * 10/1997 White ................ H01L 21/67103
156/345.52

(Continued)

FOREIGN PATENT DOCUMENTS

CN         201091396 Y       7/2008
CN         111101109 A       5/2020
(Continued)

*Primary Examiner* — Aiden Lee
(74) *Attorney, Agent, or Firm* — Fenwick & West LLP

(57) ABSTRACT

A substrate processing apparatus, a method, and a program for controlling temperature of the substrate processing apparatus. A substrate processing apparatus comprising: a mounting table configured to hold a substrate to be processed in a vacuum processing container; a heat transfer gas container placed on a back side of the mounting table with a gap between the mounting table and the heat transfer gas container and configured to be cooled by a refrigerator; and a control device configured to control heating of the refrigerator to the vicinity of a first temperature on the basis of a temperature of a first control point provided near the refrigerator and then switching the heating control for the refrigerator on or off.

7 Claims, 6 Drawing Sheets

(51) Int. Cl.
*H01J 37/32* (2006.01)
*H01J 37/34* (2006.01)

(52) U.S. Cl.
CPC ....... *H01J 37/34* (2013.01); *H01J 2237/2001* (2013.01); *H01J 2237/332* (2013.01)

(58) Field of Classification Search
CPC ..... C23C 14/541; C23C 14/34; C23C 14/505; F24H 9/06
USPC ................................................ 118/724–725
See application file for complete search history.

(56) References Cited

U.S. PATENT DOCUMENTS

| | | | | |
|---|---|---|---|---|
| 5,835,334 | A * | 11/1998 | McMillin | H01L 21/6831 |
| | | | | 279/128 |
| 6,406,545 | B2 * | 6/2002 | Shoda | H01L 21/6831 |
| | | | | 118/724 |
| 7,311,782 | B2 * | 12/2007 | Strang | H01L 21/68757 |
| | | | | 118/724 |
| 11,417,504 | B2 | 8/2022 | Nakagawasai et al. | |
| 2010/0122774 | A1 * | 5/2010 | Makabe | H01L 21/67109 |
| | | | | 156/345.52 |
| 2020/0135434 | A1 | 4/2020 | Nakagawasai et al. | |
| 2021/0280777 | A1 * | 9/2021 | Nakagawasai | H10N 50/01 |
| 2021/0287916 | A1 * | 9/2021 | Nakagawasai | H01L 21/52 |
| 2022/0238314 | A1 * | 7/2022 | Yamagata | H01L 21/67103 |

FOREIGN PATENT DOCUMENTS

| | | |
|---|---|---|
| JP | 2011-127136 A | 6/2011 |
| JP | 2020-072249 A | 5/2020 |
| KR | 10-2017-0037526 A | 4/2017 |

\* cited by examiner

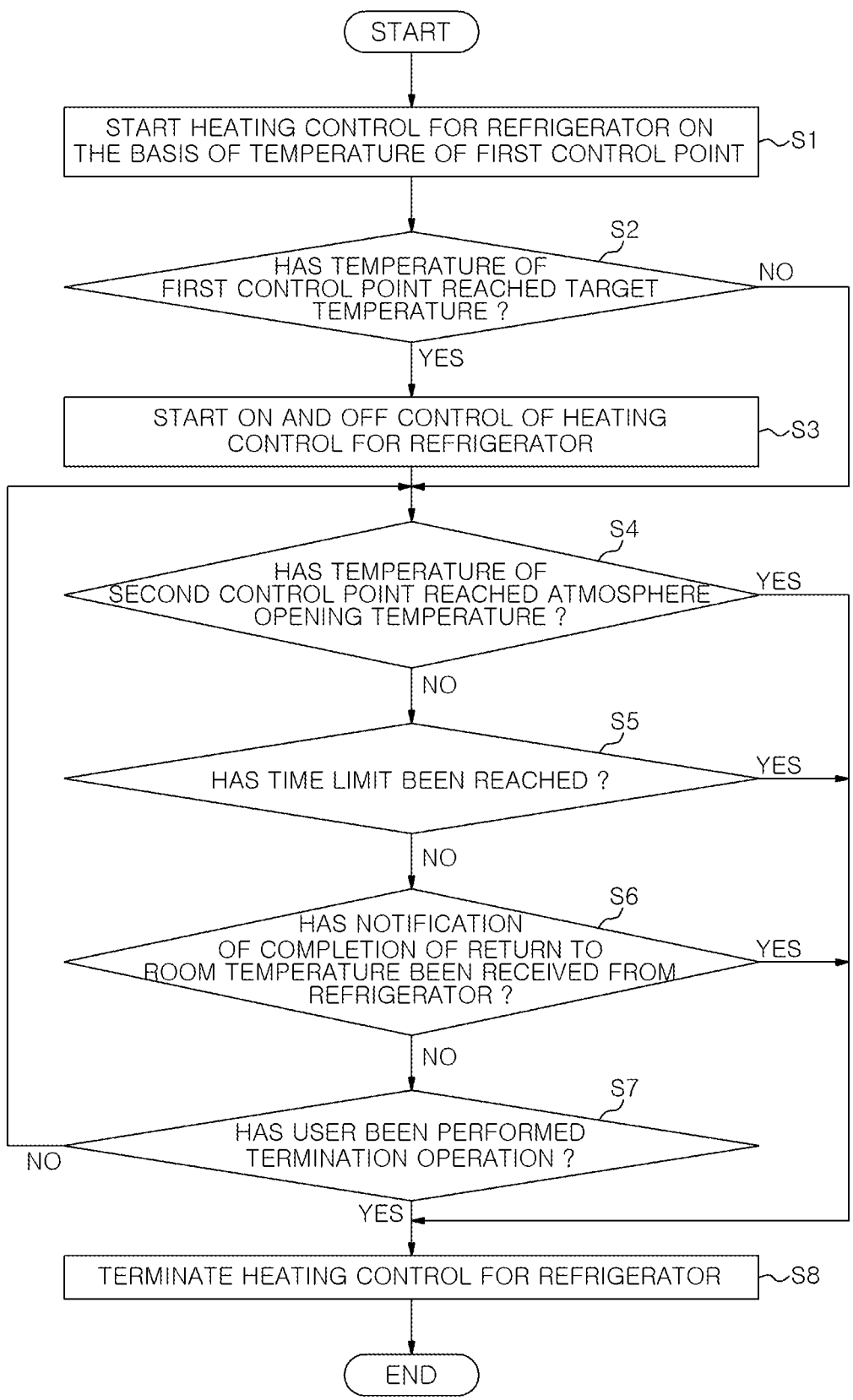

SUBSTRATE PROCESSING APPARATUS, TEMPERATURE CONTROL METHOD OF SUBSTRATE PROCESSING APPARATUS, AND PROGRAM OF CONTROL DEVICE FOR CONTROLLING SUBSTRATE PROCESSING APPARATUS

CROSS-REFERENCE TO RELATED APPLICATIONS

This application claims priority to Japanese Patent Application No. 2020-212940 filed on Dec. 22, 2020, the entire contents of which are incorporated herein by reference.

TECHNICAL FIELD

The present disclosure relates to a substrate processing apparatus, a temperature control method of the substrate processing apparatus, and a program of a control device for controlling the substrate processing apparatus.

BACKGROUND

For example, Japanese Patent Application Publication No. 2020-72249 provides a stage device including a mounting table for holding a substrate to be processed in a vacuum processing container, a refrigeration heat transfer part fixedly arranged on the back side of the mounting table with a gap therebetween and configured to be cooled, a cooling fluid supplied to the gap, a stage support part having a vacuum insulation structure and configured to rotatably support the mounting table and form a cylindrical shape covering an upper part of the refrigeration heat transfer part, and a rotating part configured to support the stage support part and rotationally driven by a driving mechanism while sealed by a magnetic fluid. In Japanese Patent Application Publication No. 2020-72249, a first heat transfer part disposed under the refrigeration heat transfer part and a second heat transfer part facing the first heat transfer part are foldable, and by bringing the first heat transfer part into contact with the second heat transfer part, it is possible to respond to rapid cooling or heating with no rotation of the mounting table.

SUMMARY

The present disclosure provides a technique of optimizing temperature control in a temperature increase sequence for a return to room temperature.

In accordance with an aspect of the present disclosure, there is provided a substrate processing apparatus comprising: a mounting table configured to hold a substrate to be processed in a vacuum processing container; a heat transfer gas container placed on a back side of the mounting table with a gap between the mounting table and the heat transfer gas container and configured to be cooled by a refrigerator; and a control device configured to control heating of the refrigerator to the vicinity of a first temperature on the basis of a temperature of a first control point provided near the refrigerator and then switching the heating control for the refrigerator on or off.

BRIEF DESCRIPTION OF THE DRAWINGS

FIG. 6 is an example flowchart illustrating a procedure in which the control device performs room temperature return control.

DETAILED DESCRIPTION

Figure 1:
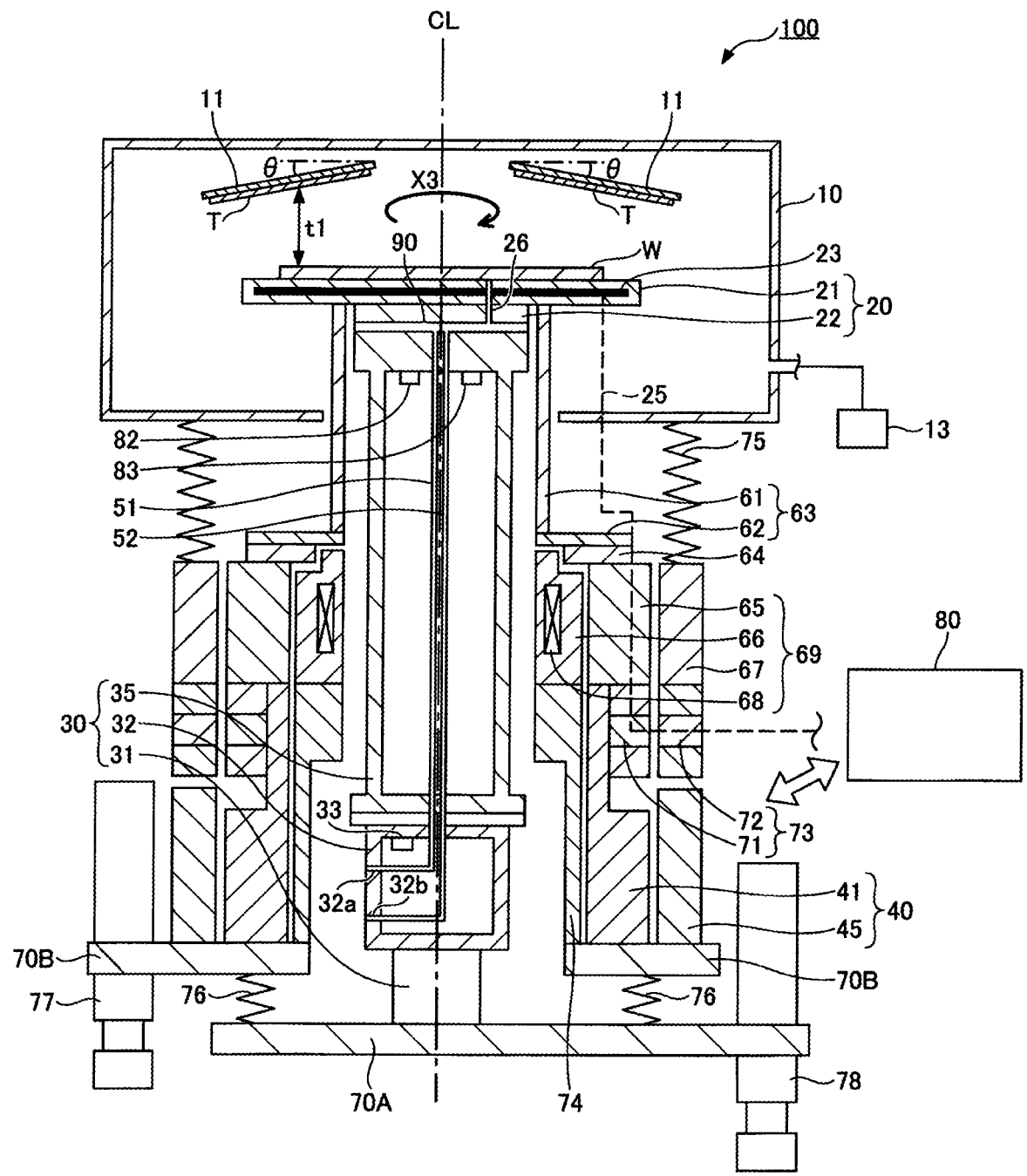
FIG. 1 is a longitudinal cross-sectional view illustrating an example of a substrate processing apparatus according to an embodiment.

Hereinafter, as an implementation example of the present disclosure, a substrate processing apparatus, a temperature control method of the substrate processing apparatus, and a program of a control device for controlling the substrate processing apparatus will be described with reference to the drawings. In each drawing, the same reference numerals are assigned to the same elements, and a duplicate description thereof may be omitted.

[Substrate Processing Apparatus]

First, referring to FIG. 1, an example of a substrate processing apparatus according to an embodiment of the present disclosure will be described. FIG. 1 is a longitudinal cross-sectional view illustrating an example of a substrate processing apparatus according to an embodiment. A substrate processing apparatus 100 shown in FIG. 1 is, for example, an apparatus for forming a vacuum atmosphere and forming a desired film on a substrate W such as a semiconductor wafer, which is a substrate to be processed, inside a vacuum processing container 10 that executes substrate processing by a processing gas. The substrate processing apparatus is a physical vapor deposition (PVD) apparatus.

The substrate processing apparatus 100 includes a vacuum processing container 10, a mounting table 20, a refrigeration device 30, a rotating device 40, a first elevating device 77, and a second elevating device 78. The mounting table 20 mounts the substrate W inside the vacuum processing container 10. The rotating device 40 rotates the mounting table 20. The first elevating device 77 elevates or lowers the mounting table 20. The second elevating device 78 elevates or lowers the refrigeration device 30. Also, the substrate processing apparatus 100 has a control device 80 for controlling various devices such as the refrigeration device 30 or the first elevating device 77. Also, in the illustrated example, the substrate processing apparatus 100 may include the first elevating device 77 for elevating or lowering the mounting table 20 and the second elevating device 78 for elevating or lowering the refrigeration device 30. However, the mounting table 20 and the refrigeration device 30 may be elevated or lowered by a common elevating device.

Inside the vacuum processing container 10, the mounting table 20 is located below, and a plurality of target holders 11 are located above the mounting table 20 and fixed at a predetermined inclination angle θ with respect to the horizontal plane. Also, different types of targets T are attached to lower surfaces of the target holders 11. The inclination angle θ may be 0 degrees, that is, the target holder 11 may be horizontally fixed.

The vacuum processing container 10 may be configured to depressurize the inside thereof to a vacuum state by operating an exhaust device 13 such as a vacuum pump. In the vacuum processing container 10, a processing gas necessary for sputtering film formation (e.g., rare gases such as argon (Ar), krypton (Kr), and neon (Ne) or nitrogen (N2) gas) is supplied from a processing gas supply device (see FIG. 2).

An alternating current (AC) voltage or a direct current (DC) voltage is applied from a plasma generation power supply (not shown) to the target holders 11. When an AC voltage is applied from the plasma generation power source to the target holder 11 and the target T, plasma is generated inside the vacuum processing container 10, and the rare gas or the like in the vacuum processing container 10 is ionized. Then, the target T is sputtered by the ionized rare gas element or the like. The atom or molecule of the sputtered target T is deposited on the surface of the substrate W held on the mounting table 20 to face the target T.

By inclining the target T with respect to the substrate W, a user can adjust the incident angle at which particles sputtered from the target T enter the substrate W, and it is possible to increase the in-plane uniformity of the film thickness of the magnetic film or the like formed on the substrate W. Even when the target holders 11 are installed at the same inclination angle θ inside the vacuum processing container 10, the mounting table 20 may be elevated or lowered to change the distance t1 between the target T and the substrate W, and thus, it is possible to change the angle of incidence of the sputtered particles with respect to the substrate W. Therefore, for each target T to be applied, the mounting table 20 is controlled to be elevated or lowered so that the distance t1, which is very suitable for each target T, may be maintained.

The number of targets T is not particularly limited, but it is preferable that a plurality of different types of targets T be present inside the vacuum processing container 10 in that different types of films made of different types of materials can be sequentially formed in one substrate processing apparatus 100.

The refrigeration device 30 retains a refrigerator 31, a cold head part 32, and a heat transfer gas container 35 and cools an upper surface of the heat transfer gas container 35 to an extremely low temperature (e.g., −30° C. or lower). The refrigerator 31 has a cold head part 32 on an upper portion and transfers cold or heat from the cold head part 32 to the heat transfer gas container 35. From the viewpoint of cooling capacity, the refrigerator 31 is preferably a type using a Gifford-McMahon (GM) cycle. When forming a magnetic film used for a tunnel magnetic resistance (TMR) element, the cooling temperature of the heat transfer gas container 35 by the refrigerator 31 is preferably in the range of −223° C. to −23° C. (50K to 250K).

Also, the control device 80 may switch the refrigerator 31 to a heating mode by driving the refrigerating cycle of the refrigerator 31 in reverse. By switching the refrigerator 31 to the heating mode at the time of maintenance or the like, it is possible to heat the mounting table 20 through the heat transfer gas container 35 and return the temperature to room temperature.

The cold head part 32 is provided with a temperature sensor 33 for detecting the temperature of the cold head part 32. For example, a low-temperature-specific temperature sensor such as a silicon diode temperature sensor or a platinum resistance temperature sensor may be used as the temperature sensor 33. Measurement data measured by the temperature sensor 33 is transmitted to the control device 80 at any time.

The temperature sensor 33 may be positioned on the rear side of the upper surface of the cold head part 32 (the temperature of the lower part of the heat transfer gas container 35 can be detected) or may be located on the side surface of the cold head part 32 (wiring to the control device 80 becomes easy). However, the position of the temperature sensor 33 is not limited thereto, and any position may be allowed as long as the temperature of the cold head part 32 can be suitably detected and controlled. It is preferable that a first control point be provided on the upper portion of the cold head part 32 and a second control point is provided on the upper portion of the heat transfer gas container 35.

The heat transfer gas container 35 is fixed on the refrigerator 31, and the upper portion thereof is housed inside the vacuum processing container 10. The heat transfer gas container 35 is made of copper (Cu) or the like with high thermal conductivity, and its outer shape is substantially cylindrical. The heat transfer gas container 35 is arranged so that its center coincides with the central axis CL of the mounting table 20.

A refrigerant supply flow path 51 (an example of a refrigerant flow path) and a refrigerant discharge flow path 52 (an example of a refrigerant flow path) are arranged inside the heat transfer gas container 35 and the refrigerator 31. The refrigerant supply flow path 51 supplies heat transfer gas refrigerant to a gap 90 between the mounting table 20 and the heat transfer gas container 35 provided on the back surface side of the mounting table 20. The refrigerant discharge flow path 52 discharges the refrigerant of which the temperature has been raised by heat transfer from the mounting table 20.

Also, the refrigerant supply flow path 51 and the refrigerant discharge flow path 52 are fixed to connection fixing parts 32a and 32b on the wall surface of the cold head part 32, respectively. The refrigerant is supplied from the refrigerant supply device (see FIG. 2) and is supplied to the gap 90 through the refrigerant supply flow path 51. As the refrigerant supplied to the gap 90 to cool the mounting table 20, helium (He) gas with high thermal conductivity is preferably used.

The mounting table 20 has a structure in which a first plate 21, which is located above and on which the substrate W is mounted, and a second plate 22, which is located below, are stacked, and the two plates are made of copper (Cu) with high thermal conductivity. The first plate 21 includes an electrostatic chuck. The electrostatic chuck has a chuck electrode 23 embedded in a dielectric film. A predetermined potential is applied to the chuck electrode 23 via a wiring 25. With this configuration, it is possible to adsorb the substrate W by the electrostatic chuck and to fix the substrate W to the upper surface of the mounting table 20. Also, in addition to the stack of the first plate 21 and the second plate 22, the mounting table 20 may have a form in which the entirety of the mounting table 20 is formed by one plate or may be integrally formed as a whole by sintering or the like.

A through-hole 26 that vertically passes through the first plate 21 and the second plate 22 is formed in the mounting table 20. The through-hole 26 communicates with the gap 90 below the mounting table 20, and the refrigerant supplied to the gap 90 is supplied to a space between the upper surface of the mounting table 20 (electrostatic chuck) and the lower surface of the substrate W through the through-hole 26. Thus, it is possible to efficiently transfer refrigerant and refrigerant contained in the heat transfer gas container 35 to the substrate W.

Figure 2:
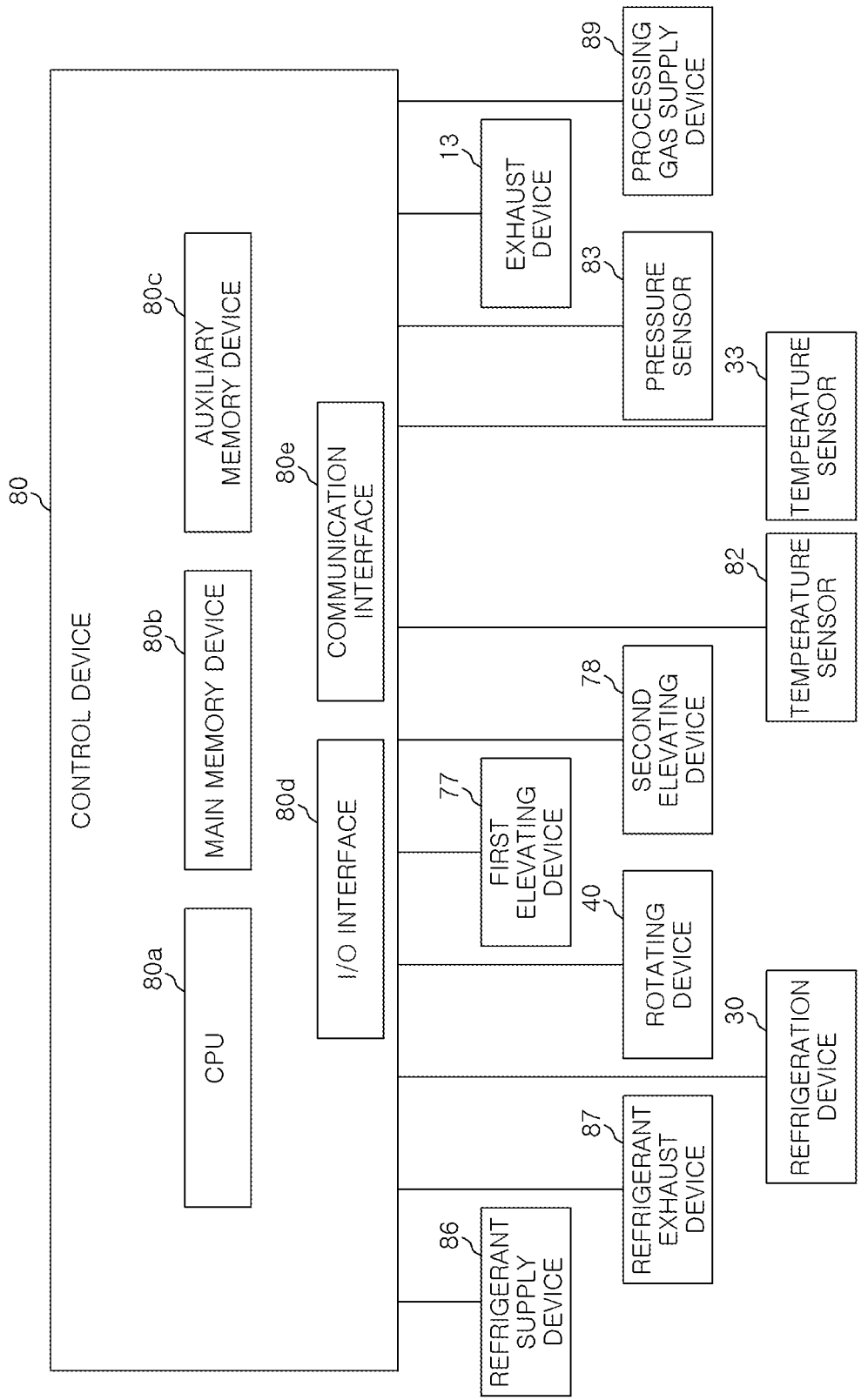
FIG. 2 is an example block diagram of a control device.

Meanwhile, the refrigerant discharged from the gap 90 flows through the refrigerant discharge flow path 52 and is discharged to the refrigerant exhaust device (see FIG. 2).

Also, the refrigerant supply flow path 51 and the refrigerant discharge flow path 52 may be formed as the same flow path.

With this configuration, the mounting table 20 can be cooled to an extremely low temperature by supplying the refrigerant to the gap 90 through the refrigerant supply flow path 51. Also, a heat conductive grease with high heat conductivity may be used as the refrigerant instead of the cooling gas. By adjusting the temperature of the refrigerant, the mounting table 20 can be adjusted to a desired temperature.

Also, in the example of FIG. 1, the refrigerant flowing through the refrigerant supply flow path 51 is supplied to the lower surface of the substrate W through the through-hole 26, and the refrigerant discharged through the through-hole 26 is discharged through the refrigerant discharge flow path 52. However, the refrigerant may be supplied or discharged in other manners. For example, the through-hole 26 is provided with an independent refrigerant flow path different from the refrigerant supply flow path 51 and the refrigerant discharge flow path 52, and the refrigerant may be supplied or discharged through the through-hole 26 through the independent refrigerant flow path.

The mounting table 20 is supported by an outer cylinder 63. The outer cylinder 63 is arranged so as to cover the outer peripheral surface of an upper portion of the heat transfer gas container 35, and the upper portion enters the inside of the vacuum processing container 10 and supports the mounting table 20 inside the vacuum processing container 10. The outer cylinder 63 has a cylindrical part 61 having an inner diameter slightly larger than the outer diameter of the heat transfer gas container 35 and a flange part 62 extending in the outer diameter direction on the lower surface of the cylindrical part 61, and the cylindrical part 61 directly supports the mounting table 20. The cylindrical part 61 and the flange part 62 are formed of a metal such as stainless steel.

A heat-insulating member 64 is connected to the lower surface of the flange part 62. The heat-insulating member 64 has a substantially cylindrical shape extending coaxially with the flange part 62 and is fixed to the lower surface of the flange part 62. The heat-insulating member 64 is made of ceramic such as alumina. A magnetic fluid sealing part 69 is provided on the lower surface of the heat-insulating member 64.

The magnetic fluid sealing part 69 has a rotating part 65, an inner fixing part 66, an outer fixing part 67, and a heating source 68. The rotating part 65 has a substantially cylindrical shape extending coaxially with the heat-insulating member 64 and is fixed to the lower surface of the heat-insulating member 64. In other words, the rotating part 65 is fixed to the outer cylinder 63 via the heat-insulating member 64 therebetween. With this configuration, the heat transfer of the refrigerant contained in the outer cylinder 63 to the rotating part 65 is blocked by the heat-insulating member 64, and thus it is possible to prevent the deterioration of sealing performance or the occurrence of dew condensation caused by the temperature drop of the magnetic fluid of the magnetic fluid sealing part 69.

The inner fixing part 66 is provided between the heat transfer gas container 35 and the rotating part 65 via a magnetic fluid therebetween. The inner fixing part 66 has a substantially cylindrical shape having an inner diameter greater than the outer diameter of the heat transfer gas container 35 and an outer diameter smaller than the inner diameter of the rotating part 65. The outer fixing part 67 is provided outside the rotating part 65 via a magnetic fluid therebetween. The heating source 68 is embedded inside the inner fixing part 66 and heats the entirety of the magnetic fluid sealing part 69. With this configuration, it is possible to prevent the deterioration of sealing performance or the occurrence of dew condensation caused by the temperature drop of the magnetic fluid of the magnetic fluid sealing part 69. With these configurations, in the magnetic fluid sealing part 69, the rotating part 65 is rotatable with respect to the inner fixing part 66 and the outer fixing part 67 in an airtight state. That is, the outer cylinder 63 is rotatably supported via the magnetic fluid sealing part 69.

A substantially cylindrical bellows 75 is provided between the upper surface of the outer fixing part 67 and the lower surface of the vacuum processing container 10. The bellows 75 is a metal bellows structure that can be vertically expanded or contracted. The bellows 75 surrounds the upper portion of the heat transfer gas container 35, the lower portion of the outer cylinder 63, and the heat-insulating member 64 and separates the internal space of the vacuum processing container 10, which is capable of being depressurized, from the external space of the vacuum processing container 10.

A slip ring 73 is provided below the magnetic fluid sealing part 69. The slip ring 73 has a rotating body 71 including a metal ring and a fixed body 72 including a brush. The rotating body 71 has a substantially cylindrical shape extending coaxially with the rotating part 65 of the magnetic fluid sealing part 69 and is fixed to the lower surface of the rotating part 65. The fixed body 72 has a substantially cylindrical shape having an inner diameter slightly greater than the outer shape of the rotating body 71. The slip ring 73 is electrically connected to a DC power supply (not shown) and supplies power supplied from the DC power supply to the wiring 25 through the brush of the fixed body 72 and the metal ring of the rotating body 71. With this configuration, it is possible to apply an electric potential from the DC power supply to the chuck electrode without causing twisting or the like in the wiring 25. The rotating body 71 constituting the slip ring 73 is attached to the rotating device 40. Also, the slip ring 73 may have a structure other than the brush structure and may have, for example, a non-contact power feeding structure or a structure having an anhydrous or conductive liquid.

The rotating device 40 is a direct drive motor having a rotor 41 and a stator 45. The rotor 41 has a substantially cylindrical shape extending coaxially with the rotating body 71 of the slip ring 73 and is fixed to the rotating body 71. The stator 45 has a substantially cylindrical shape having an inner diameter greater than the outer diameter of the rotor 41. With the above configuration, when the rotor 41 rotates, the rotating body 71, the rotating part 65, the outer cylinder 63, and the mounting table 20 rotate in the X3 direction relative to the heat transfer gas container 35. Also, the rotating device may have a form other than the direct drive motor and may have a form including a servomotor and a transmission belt.

Also, a heat-insulating body 74 having a vacuum heat-insulating double structure is provided around the refrigeration device 30. In the illustrated example, the heat-insulating body 74 is provided between the refrigerator 31 and the cold head part 32 and the rotor 41 and between the lower portion of the heat transfer gas container 35 and the rotor 41. With this configuration, it is possible to prevent the cold or heat of the refrigerator 31 and the heat transfer gas container 35 from being transferred to the rotor 41.

Also, the refrigerator 31 is fixed to the upper surface of a first support base 70A which is elevatably attached to the second elevating device 78. Meanwhile, the heat-insulating body 74 of the rotating device 40 is fixed to the upper surface of a second support base 70B which is elevatably attached to the first elevating device 77. Also, a substantially cylindrical bellows 76 surrounding the refrigerator 31 is provided between the upper surface of the first support base 70A and the lower surface of the second support base 70B. Like the bellows 75, the bellows 76 is a metal bellows structure that can be vertically expanded or contracted.

Also, a second cooling gas supply (not shown) that supplies a cooling gas (e.g., a second cooling gas) different from a cooling gas (e.g., a first cooling gas) flowing through the refrigerant supply flow path 51 may be provided around the refrigerator 31 and the heat transfer gas container 35. The second cooling gas supply supplies the second cooling gas to the space between the heat transfer gas container 35 and the outer cylinder 63. The second cooling gas is a gas with a thermal conductivity different from that of the first cooling gas flowing through the refrigerant supply flow path 51 and is preferably a gas with relatively low thermal conductivity. As a result, it is possible to enable the temperature of the second cooling gas to be relatively higher than the temperature of the first cooling gas flowing through the refrigerant supply flow path 51. Thus, it is possible to prevent the first cooling gas leaking from the gap 90 into the lateral space from entering the magnetic fluid sealing part 69. In other words, the second cooling gas functions as a counterflow to the first cooling gas leaking from the gap 90. With this configuration, it is possible to prevent the deterioration of sealing performance or the occurrence of dew condensation caused by the temperature drop of the magnetic fluid of the magnetic fluid sealing part 69. Also, in terms of the enhancement of the function as a counterflow, preferably, the supply pressure of the second cooling gas supplied from the second cooling gas supply is substantially the same as or slightly higher than the supply pressure of the first cooling gas flowing through the refrigerant supply flow path 51. Also, a low boiling point gas such as argon gas or neon may be used as the second cooling gas.

A temperature sensor 82 for detecting the temperature of the gap 90 and the like and a pressure sensor 83 for detecting the pressure of the gap 90 and the like are provided above the heat transfer gas container 35. For example, a low-temperature-specific temperature sensor such as a silicon diode temperature sensor or a platinum resistance temperature sensor may be used as the temperature sensor 82. Measurement data measured by the temperature sensor 82 and the pressure sensor 83 is transmitted to the control device 80 at any time.

Also, among the components of the substrate processing apparatus 100, the refrigeration device 30 is configured to be elevatable by the second elevating device 78, and the components other than the refrigeration device 30 and the vacuum processing container 10 are configured to be elevatable by the first elevating device 77.

By elevating or lowering the refrigeration device 30 using the second elevating device 78, it is possible to eliminate the change in the gap 90 between the mounting table 20 and the heat transfer gas container 35. Specifically, the heat transfer gas container 35 shrinks by about several millimeters due to its cold or heat, and the heat shrinkage may change the height (or width) of the gap 90. When the heat transfer gas container 35 heat-shrinks and the gap 90 changes even with the mounting table 20 fixed at a predetermined height during the film forming process, the elevating and the lowering of the refrigeration device 30 is precisely controlled by the second elevating device 78. This control makes it is possible to eliminate the change in the gap 90 and continue the film forming process while maintaining the initial gap 90.

Meanwhile, the distance t1 between the target T and the substrate W may be adjusted by, for example, the first elevating device 77 elevating or lowering the mounting table 20 inside the vacuum processing container 10. The adjustment of the distance t1 is appropriately changed according to the type of the target T to be applied. When the distance t1 is adjusted by elevating or lowering the mounting table 20, the control device 80 performs control to synchronize the first elevating device 77 and the second elevating device 78. Through the synchronization control of the first elevating device 77 and the second elevating device 78 by the control device 80, the mounting table 20 and the refrigeration device 30 may be controlled to be elevated or lowered while the initial gap 90 is maintained.

The control device 80 is a device having the function of a computer, a microcomputer, or an information processing device, or the like. The control device 80 will be described in detail with reference to FIG. 2.

<Configuration Example of Control Device>

FIG. 2 is an example block diagram of the control device 80. The control device 80 includes a central processing unit (CPU) 80a, a main memory device 80b, an auxiliary memory device 80c, an input/output (I/O) interface 80d, and a communication interface 80e, which are connected to each other by a connection bus. The main memory device 80b and the auxiliary memory device 80c are computer-readable recording media. Also, the above components may be provided individually, or some of the components may not be provided.

The CPU 80a is also referred to as a microprocessor (MPU) or a processor and may be a single processor or a multiprocessor. The CPU 80a is a central processing unit that controls the entire control device 80. The CPU 80a provides a function that meets a predetermined purpose by, for example, deploying a program stored in the auxiliary memory device 80c to be executed in the work area of the main memory device 80b and controlling peripheral devices through the execution of the program. The main memory device 80b stores a computer program executed by the CPU 80a, data processed by the CPU 80a, and the like. The main memory device 80b includes, for example, a flash memory, a random access memory (RAM), or a read-only memory (ROM). The auxiliary memory device 80c stores various types of programs and data in a readable and writable recording medium and is also called an external memory device. For example, an operating system (OS), various programs, various tables, and the like are stored in the auxiliary memory device 80c, and the OS includes, for example, a communication interface program for communicating data with an external device connected through a communication interface 80e. The auxiliary memory device 80c is used, for example, as a memory region for assisting the main memory device 80b and stores a computer program executed by the CPU 80a, data processed by the CPU 80a, and the like. The auxiliary memory device 80c is a silicon disk including a non-volatile semiconductor memory (a flash memory, an erasable programmable ROM (EPROM), and the like), a hard disk drive (HDD) device, a solid-state drive device, or the like. Also, a drive device for a removable recording medium such as a CD drive device, a DVD drive device, or a Blu-ray Drive (BD) drive device is exemplified as the auxiliary memory device 80c. Examples of the removable recording medium include a CD, DVD, BD, Universal Serial Bus (USB) memory, Secure Digital (SD) memory card, and the like. The communication interface 80e is an interface with a network connected to the control device 80. The I/O interface 80d is an interface for inputting or outputting data to or from a device connected to the control device 80. For example, a keyboard, a pointing device such as a touch panel or a mouse, an input device such as a microphone, or the like is connected to the I/O interface 80d. The control device 80 receives an operation instruction or the like from an operator who operates the input device through the I/O interface 80d. Also, for example, a display device such as a liquid crystal display (LCD) panel or an organic electroluminescence (EL) panel and an output device such as a printer or a speaker are connected to the I/O interface 80d. The control device 80 outputs data or information processed by the CPU 80a and data or information stored in the main memory device 80b and the auxiliary memory device 80c through the I/O interface 80d. Also, the temperature sensor 33 or 82 or the pressure sensor 83 may be connected to the I/O interface 80d in a wired manner and may be connected to the communication interface 80e over a network.

The control device 80 controls the operations of various peripheral devices. Examples of the peripheral devices include a refrigerant supply device 86, a refrigerant exhaust device 87, a refrigeration device 30, a rotating device 40, a first elevating device 77, a second elevating device 78, a temperature sensor 82, a pressure sensor 83, an exhaust device 13, a processing gas supply device 89, and the like. The CPU 80a executes a predetermined process according to a recipe stored in a memory region such as a ROM. In the recipe, control information of the substrate processing apparatus 100 with respect to process conditions is set. The control information includes, for example, a gas flow rate, the pressure in the vacuum processing container 10, the temperature in the vacuum processing container 10, the temperature of the mounting table 20, the temperature of the refrigerant supplied to the gap 90, the height and width of the gap 90, and various types of process times, etc.

The control device 80 controls the refrigerant supply device 86, the exhaust device 13, and the refrigeration device 30 on the basis of data (monitoring information) measured by the temperature sensor 82 and the pressure sensor 83 so that the gap 90 maintains the initial temperature and pressure.

For room temperature return control, the control device 80 requires the refrigerator 31 to perform room temperature return control. The control device 80 performs control to switch the heating control for the refrigerator 31 on and off on the basis of the data (monitoring data) measured by the temperature sensor 33 (hereinafter, the control to switch on and off is simply referred to as "on and off control").

When the height (or width) of the gap 90 changes due to the heat shrinkage of the heat transfer gas container 35, the control device 80 precisely elevates or lowers the refrigeration device 30 to eliminate the change in the gap 90 by controlling the elevating or lowering of the second elevating device 78. The heat shrinkage of the heat transfer gas container 35 is caused by the transfer of cold or heat from the refrigerator 31 to the heat transfer gas container 35 and the flow of the refrigerant through the refrigerant supply flow path 51. By the control device 80 maintaining the initial gap 90, it is possible to continue the film forming process while controlling the substrate W to a desired temperature.

Also, the control device 80 performs control to synchronize the first elevating device 77 and the second elevating device 78. By this synchronous control, the control device 80 elevates or lowers the mounting table 20 (and the upper portion of the refrigeration device 30) inside the vacuum processing container 10 while maintaining the initial gap 90 and adjusts the distance t1 between the target T and the substrate W which is very suitable for the target T to be applied.

<Regarding Room Temperature Return Control for Maintenance Work>

The substrate processing apparatus 100 according to an embodiment of the present disclosure is subject to regular or irregular maintenance work. The maintenance work includes, for example, cleaning the inside of the vacuum processing container 10, exchanging targets T, etc.

Since as described above, the substrate processing apparatus 100 controls the mounting table 20 to be an extremely low temperature and performs the film forming process on the substrate W, immediately after the film forming process or the like, the mounting table 20 and the refrigeration device 30 are the extremely low temperature. When the vacuum processing container 10 is opened in this state, an unfavorable situation such as dew condensation may occur in the mounting table 20 and the refrigeration device 30.

Therefore, before initiating the maintenance work, the operator gives an instruction to the control device 80 to perform room temperature return control. The control device 80 performs room temperature return control for returning the temperatures of the mounting table 20 and the refrigeration device 30 to room temperature in response to the instruction. In this embodiment, an aspect in which the refrigerator 31 has a temperature control logic and the refrigerator 31 controls the temperature to be room temperature on the basis of the temperature control logic will be described. However, the control device 80 may perform room temperature return control on the basis of its own temperature control logic.

Temperature control which is a preferable comparative example of the temperature control of the present disclosure will be described with reference to FIGS. 3 and 4. FIG. 3A is a configuration diagram of the simplified configuration of the substrate processing apparatus 100 of FIG. 1. As described above with reference to FIG. 1, the substrate processing apparatus 100 has the temperature sensor 82 in the heat transfer gas container 35 and has the temperature sensor 33 in the cold head part 32.

For convenience of explanation, room temperature return control based on the temperature detected by the temperature sensor 33 of the cold head part 32 is referred to as temperature control based on a first control point, and room temperature return control based on the temperature detected by the temperature sensor 82 of the heat transfer gas container 35 is referred to as temperature control based on a second control point. In FIG. 3A, the first control point is a control point for the room temperature return control. The temperature of the first control point and the temperature of the second control point are input to the refrigerator 31.

Figure 3B:
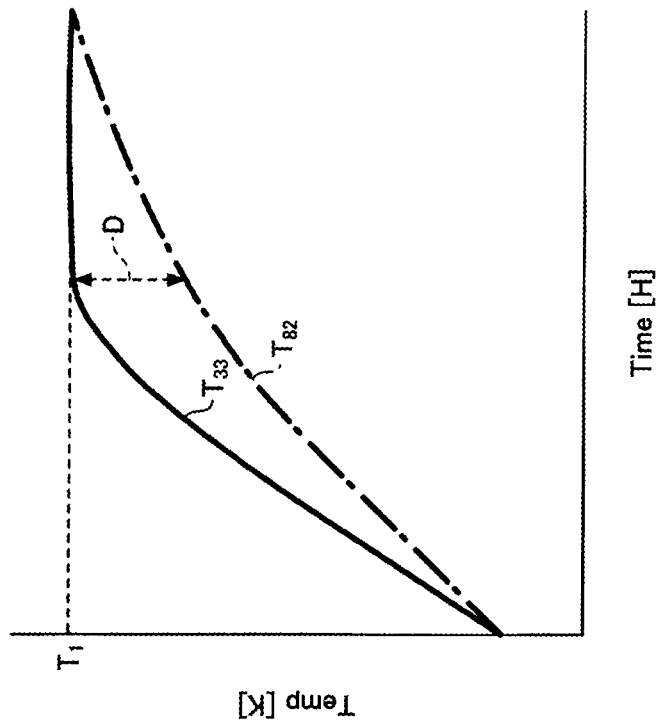
FIGS. 3A and 3B are example diagrams illustrating temperature control which are used as comparative examples of the temperature control of the present disclosure.
Figure 3A:
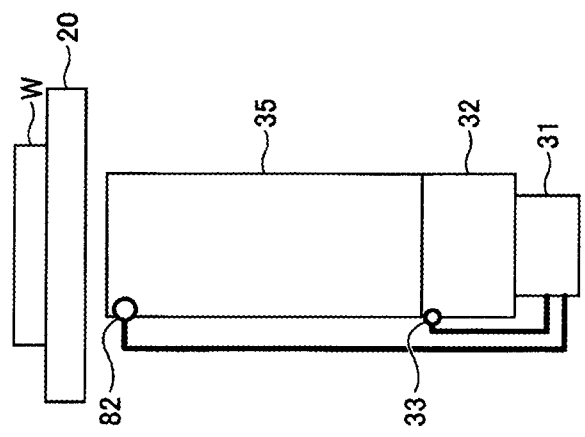

FIG. 3B is a diagram showing the changes in temperatures of the first control point and the second control point in the case of the temperature control based on the first control point. T33 is a temperature detected by the temperature sensor 33 (the temperature T33 of the first control point), and T82 is a temperature detected by the temperature sensor 82 (the temperature T82 of the second control point). The control device 80 requires the refrigerator 31 to control the temperature to be the target temperature T1 in order to control the temperature T33 of the first control point to be the target temperature T1 (an example of the first temperature). The refrigerator 31 starts heating control in order to return the temperature T33 of the first control point (a low temperature state) to the target temperature T1.

The target temperature T1 will be described. The higher the temperature of the cold head part 32 is, the earlier the temperature of the heat transfer gas container 35 returns to room temperature. However, since the heat resistance of a joint part between the cold head part 32 and the heat transfer gas container 35 has an upper limit, the target temperature T1 is set in consideration of the heat resistance. The target temperature T1 is, for example, 320 K (Kelvin). However, the target temperature T1 is not limited thereto and may be appropriately set according to the heat resistance of the joint part or the like.

As shown in FIG. 3B, at the timing when the temperature T33 of the first control point reaches the target temperature T1, there is a difference between the temperature T33 of the first control point and the temperature T82 of the second control point. That is, since the temperature T82 of the second control point is lower than not only the target temperature T1 but also room temperature, dew condensation may occur when an operator opens the vacuum processing container 10 for the maintenance work. Also, the occurrence of a difference in temperature between the first control point and the second control point is called "temperature drift." In FIG. 3B, the temperature drift is denoted by D.

Also, since the temperature T82 of the second control point has not reached room temperature, the control device 80 may not complete the room temperature return control within the time required for the room temperature return control. The time required for the room temperature return control is, for example, several hours but is determined by the efficiency of the film forming process and the like. Also, this time may differ depending on the substrate processing apparatus 100.

The temperature control based on the second control point adopted to reduce the temperature drift will be described below. FIG. 4A is a configuration diagram of the simplified configuration of the substrate processing apparatus 100 of FIG. 1. In FIG. 4A, the second control point is a control point for the room temperature return control.

Figure 4B:
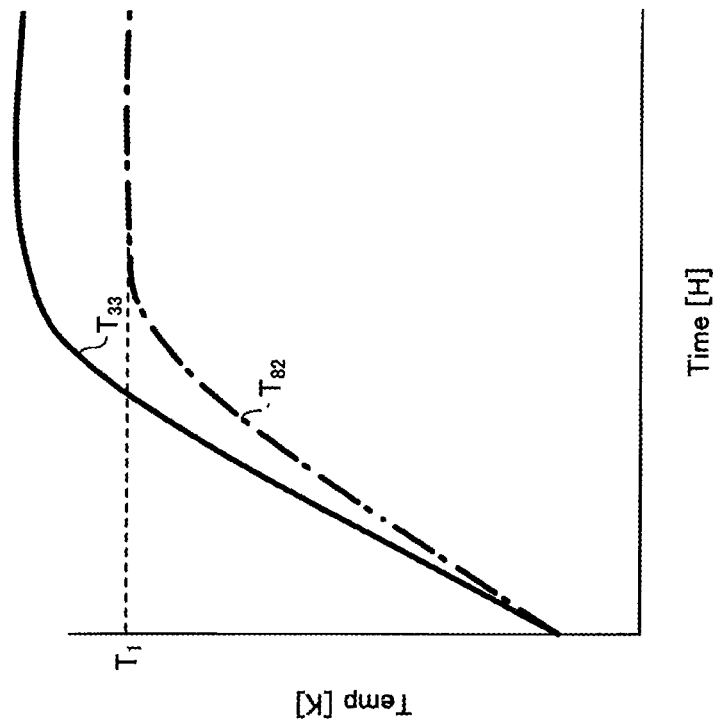
FIGS. 4A and 4B are example diagrams illustrating temperature control which are used as comparative examples of the temperature control of the present disclosure.
Figure 4A:
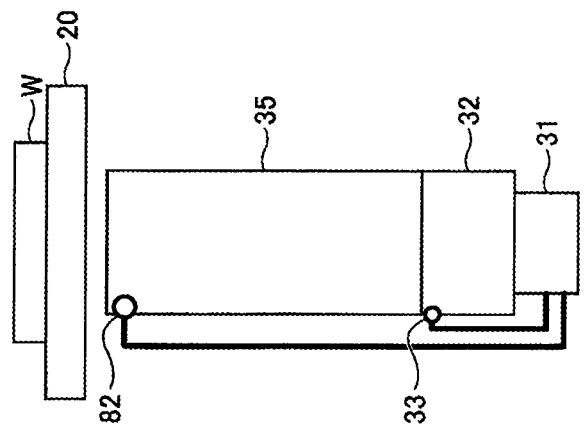

FIG. 4B is a diagram showing the changes in temperatures of the first control point and the second control point in the case of the temperature control based on the second control point. The control device 80 requires the refrigerator 31 to control the temperature to be the target temperature T1 in order to control the temperature T82 of the second control point to be the target temperature T1. The refrigerator 31 starts heating control in order to return the temperature T82 of the second control point (a low temperature state) to the target temperature T1.

In the room temperature return control based on the temperature T82 of the second control point, the second control point may reach the target temperature T1 (i.e., room temperature) earlier than the temperature T33 of the first control point is controlled to the target temperature T1. Since the temperature T82 of the second control point is controlled to room temperature or the target temperature T1 which is higher than room temperature, the control device 80 may complete the room temperature return control within the time required from the room temperature return control.

However, in the room temperature return control based on the temperature T82 of the second control point, the temperature T33 of the first control point is higher than the temperature T82 of the second control point, and thus the temperature T33 of the first control point exceeds the target temperature T1 before the temperature T82 of the second control point reaches the target temperature T1. That is, the temperature of the joint part between the cold head part 32 and the heat transfer gas container 35 may exceed the target temperature T1 determined in consideration of heat resistance.

As described above, in the room temperature return control of the comparative example, the temperature is reduced, and thus it is difficult to control the temperature T33 of the first control point such that the temperature T33 does not exceed the target temperature T1.

<Room Temperature Return Control of Present Disclosure>

Then, in the room temperature return control of the present disclosure, the on and off control of the heating control is started by the refrigerator 31 after the temperature T33 of the first control point is controlled to the vicinity of the target temperature T1 by the heating control for the refrigerator 31. According to the control of the present disclosure, the temperature drift remains at the timing when the temperature T33 of the first control point reaches the target temperature T1. However, by performing control to switch the heating control on or off, the control device 80 may enable the temperature T82 of the second control point close to the target temperature T1 at an early stage. In other words, the temperature T82 of the second control point can be returned to room temperature at an early stage.

Figure 5:
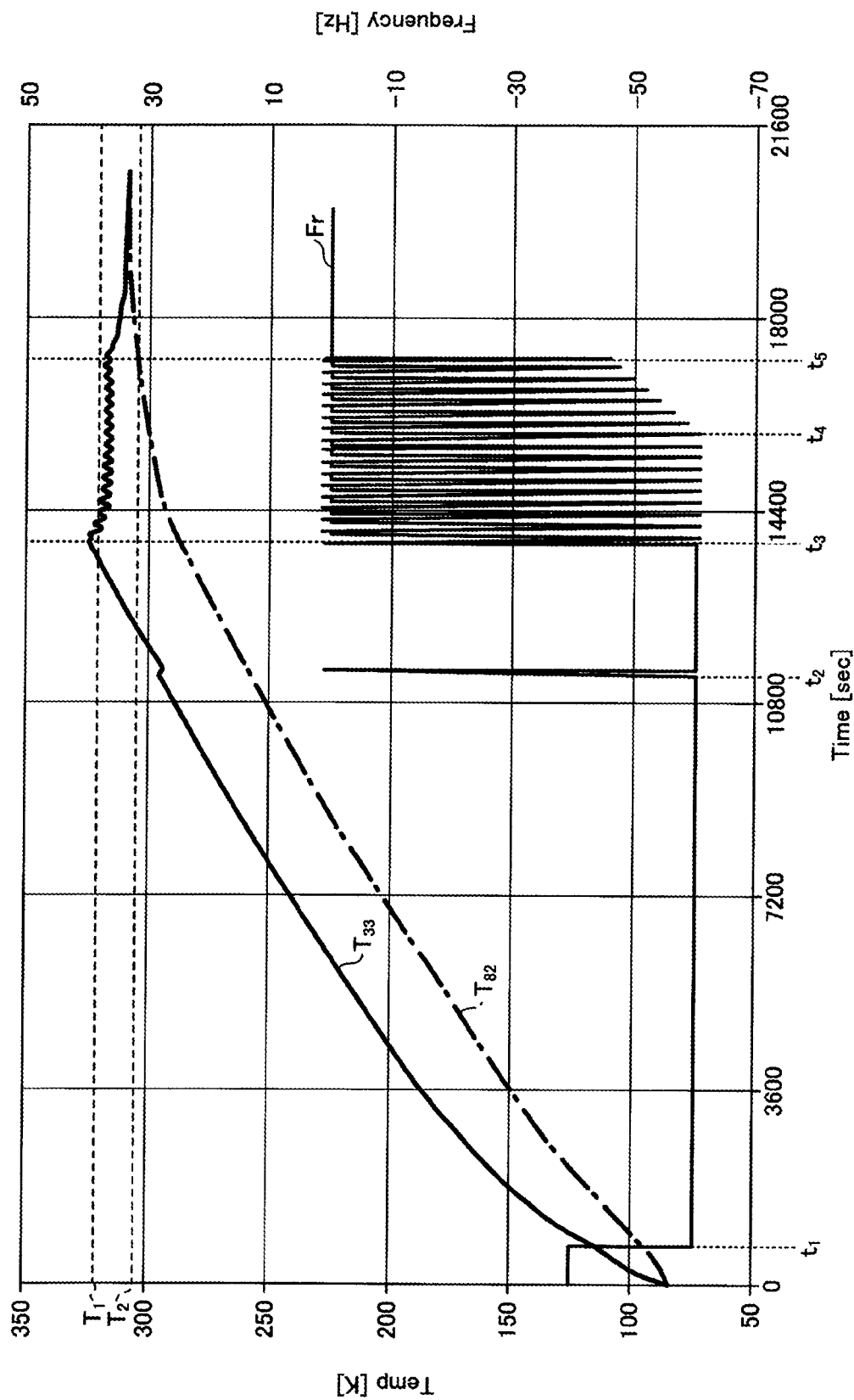
FIG. 5 is an example diagram illustrating room temperature return control of the present disclosure.

FIG. 5 is a diagram illustrating room temperature return control of the present disclosure. In FIG. 5, the horizontal axis is time (seconds), the first vertical axis (left axis) is temperature (Kelvin), and the second vertical axis (right axis) is the frequency (Hz) of the pump of the refrigerator 31.

First, the frequency of the pump of the refrigerator 31 will be described. The refrigerator 31 of the present disclosure may be switched to the heating mode by driving the refrigeration cycle in reverse. When the frequency of the pump of the refrigerator 31 is positive (+), the refrigerator 31 is in the freezing mode. When the frequency of the pump of the refrigerator 31 is negative (−), the refrigerator 31 is in the heating mode. When the frequency of the pump of the refrigerator 31 is zero (0), the refrigerator 31 is off (a state in which neither heating nor freezing is performed).

In FIG. 5, the frequency Fr denotes the number of rotations of the pump of the refrigerator 31 that circulates refrigerant. The larger the absolute value of the frequency Fr is, the larger the cooling capacity or the heating capacity is. The frequency Fr of the refrigerator 31 is controlled by an inverter. In this sense, the refrigerator 31 can switch between the freezing mode and the heating mode by the function of switching between normal rotation and reverse rotation of the inverter.

The room temperature return control of the present disclosure will be described. At time 0, an operator gives an instruction for room temperature return to the control device 80. The control device 80 executes an embedded (installed) program. This program is sometimes called a macro. A macro is data in which a plurality of operations or commands that are repeatedly used are grouped into one and can be called as needed. An editor is provided for macros, and an operator may create a new macro or edit operation contents and commands.

The control device 80 that has started executing the program transmits, to the refrigerator 31, a command to control the first control point to the target temperature T1. The refrigerator 31 has a temperature control logic based on the characteristics of the refrigerator 31 and starts temperature control to the target temperature T1 of the first control point. The refrigerator 31 controls the first control point to the target temperature T1 by, for example, feedback control (the control method may be, for example, feedforward control or the like). When the current temperature of the first control point is lower than the target temperature T1, the refrigerator 31 starts heating control.

As shown in FIG. 5, during the period from the start of the room temperature return control to a time t3 at which the first control point reaches the vicinity of the target temperature T1, the refrigerator 31 heats the cold head part 32 with the maximum capability (Fr=−60 Hz) because the difference between the current temperature of the first control point and the target temperature T1 is large. The flat region of the frequency Fr from time 0 to t1 corresponds to a control incorporated in the temperature control logic of the refrigerator 31 in order to suppress rapid heating. Also, the frequency Fr of the refrigerator 31 temporarily decreasing at time t2 corresponds to a control incorporated into temperature control logic.

Also, the current temperature of the first control point at the start of the room temperature return control may be several degrees. The current temperature may already be equal to or higher than room temperature. In these cases, since an end condition of the described room temperature return control is satisfied at time t5, the control device 80 determines that the end condition is satisfied and terminates the started room temperature return control.

At time t3, when the first control point reaches the vicinity of the target temperature T1, the control device 80 starts the on and off control of the refrigerator 31. More specifically, the control device 80 may start the on and off control of the refrigerator 31 such that the temperature T33 of the first control point does not exceed the target temperature T1. One example is the following control.

(i) When the temperature T33 of the first control point exceeds the target temperature T1−α, the control device 80 turns off the refrigerator 31 (stops heating). When the refrigerator 31 is turned off, the frequency Fr of the refrigerator 31 becomes zero (0).

(ii) When the temperature T33 of the first control point is below the target temperature T1−β, the control device 80 turns on the refrigerator 31 (resumes heating). Since the temperature T33 of the first control point is lower than the target temperature T1−β, the frequency Fr becomes a negative value when the refrigerator 31 is turned on to resume heating. Here, $\alpha$, $\beta > 0$, and $\beta > \alpha$.

When the control device 80 turns on the refrigerator 31, the refrigerator 31 performs heating control because the temperature T33 at the first control point is below the target temperature T1. In other words, the control device 80 may perform the on and off control of the heating control such that the temperature T33 of the first control point does not exceed the target temperature T1.

Also, the on and off control of the refrigerator 31 corresponds to the reverse rotation (heating) and stop (neither heating nor freezing) of the inverter of the refrigerator 31.

From time t4 to t5, the minimum value of the frequency Fr of the pump is increasing. This is for the refrigerator 31 to adjust the heating capability required according to the difference between the temperature T33 of the first control point and the target temperature T1. Even if the heating capacity changes, the on and off control of the heating control is continued.

At time t5, the temperature T82 of the second control point reaches the vicinity of an atmosphere opening temperature T2 (an example of the second temperature). The atmosphere opening temperature T2 refers to a temperature at which the mounting table 20 or the heat transfer gas container 35 (these may be regarded as being the same temperature as the temperature T82 of the second control point) does not cause a problem such as dew condensation. The atmosphere opening temperature T2 is, for example, 304 K (Kelvin) but may be a temperature that does not cause a problem such as dew condensation. The atmosphere opening temperature T2 may be experimentally obtained or may be set in the control device 80 by an operator. Under a requirement that the room temperature return control be completed at an early stage, the atmosphere opening temperature T2 is lower than the target temperature T1. However, the target temperature T1 and the atmosphere opening temperature T2 may be substantially equal.

When the temperature T82 of the second control point reaches the atmosphere opening temperature T2, the control device 80 terminates the room temperature return control. That is, the control device 80 terminates a program for the room temperature return control. When the temperature T82 of the second control point has reached the atmosphere opening temperature, the control device 80 terminates the room temperature return control, and thus it is possible to complete the room temperature return control within the time required for the room temperature return control.

Upon completion of the room temperature return control, the control device 80 terminates the on and off control of the heating control for the refrigerator 31. Therefore, the refrigerator 31 stops heating, and after time t5, the frequency Fr of the pump becomes zero. Also, when the refrigerator 31 is turned off, the refrigerator 31 does not freeze.

In FIG. 5, for the purpose of explaining the present disclosure, the control device 80 collects the temperature T33 of the first control point and the temperature T82 of the second control point even after time t5. The temperature T33 of the first control point drops because heat is taken by the heat transfer gas container 35, and the temperature T82 of the second control point rises due to the heat taken by the heat transfer gas container 35. Eventually, the temperature T33 of the first control point and the temperature T82 of the second control point become equal.

According to the room temperature return control of the present disclosure, since the control device 80 performs the room temperature return control on the basis of the temperature T33 of the first control point, it is possible to suppress the temperature T33 of the first control point from exceeding the target temperature T1. Also, the control device 80 performs the on and off control of the heating control such that the target temperature T1 is not exceeded, and thus it is possible to reduce temperature drift.

Also, the control device 80 may perform the on and off control of the heating control at the vicinity of the target temperature T1 instead of performing the on and off control of the heating control such that the target temperature T1 is not exceeded. In this case, the target temperature T1 may be reduced.

Also, not only the temperature T33 of the first control point but also the temperature T82 of the second control point may be used by the refrigerator 31 to perform temperature control of the first control point. For example, the refrigerator 31 controls the temperature T33 of the first control point on the basis of the average of the temperature T82 of the second control point. Alternatively, the refrigerator 31 controls the temperature T33 of the first control point by weighting the temperature T33 of the first control point and the temperature T82 of the second control point. Since the temperature T82 of the second control point is lower than the target temperature T1, the time taken until the second control point reaches the atmosphere opening temperature T2 can be shortened by the refrigerator 31 using the temperature T82 of the second control point to perform temperature control of the first control point.

FIG. 6 is an example flowchart illustrating each process in which the control device 80 performs room temperature return control. The processing of FIG. 6 starts when an operator instructs the control device 80 to perform room temperature return control. Also, even in the room temperature return control, helium (He) gas with high thermal conductivity may be supplied to the gap 90. If the gas is not supplied, the control device 80 may control the second elevating device 78 to bring the upper surface of the heat transfer gas container 35 into contact with the bottom surface of the second plate 22 before the start or depending on the start (the gap 90 becomes zero). During the room temperature return control, the control device 80 performs precise control to elevate or lower the second elevating device 78 so as to cancel thermal expansion of the heat transfer gas container 35 due to the temperature rise. By this control, during the room temperature return control, the gap 90 is maintained at zero, and thus it is possible to efficiently deliver the temperature of the heat transfer gas container 35 to the mounting table 20.

The control device 80 starts heating control for the refrigerator 31 on the basis of the temperature T33 of the first control point (S1). That is, when the control device 80 transmits, to the refrigerator 31, a command to control the temperature T33 of the first control point to the target temperature T1, the refrigerator 31 starts the heating control for the refrigerator 31 on the basis of the temperature T33 of the first control point and the target temperature T1.

The control device 80 monitors whether the temperature T33 of the first control point reaches the vicinity of the target temperature T1 (S2). Since the temperature T33 of the first control point is repeatedly input to the control device 80, the control device 80 determines whether the temperature T33 of the first control point has reached the target temperature T1 upon the input or on a regular basis.

When the temperature T33 of the first control point reaches the target temperature T1 (Yes in S2), the control device 80 starts the on and off control of the heating control for the refrigerator 31 (S3). That is, since the control device 80 starts the on/off control of the refrigerator 31, the refrigerator 31 performs heating control when the refrigerator 31 is turned on and terminates heating control when the refrigerator 31 is turned off. Accordingly, the refrigerator 31 turns the heating control on or off.

Until the temperature T33 of the first control point reaches the target temperature (No in S2), the control device 80 monitors whether the temperature T82 of the second control point has reached the vicinity of the atmosphere opening temperature T2 (S4). Since the temperature T82 of the second control point is repeatedly input to the control device 80, the control device 80 determines whether the temperature T82 of the second control point has reached the atmosphere opening temperature T2 upon the input or on a regular basis. Although it is less likely that the temperature T82 of the second control point reaches the atmosphere opening temperature T2 earlier than the temperature T33 of the first control point reaches the target temperature T1, a fail-safe is applied when a problem occurs, i.e., when the temperature T33 of the first control point is not input to the control device 80.

Similarly, after the control device 80 starts the on and off control of the heating control for the refrigerator 31, the control device 80 monitors whether the temperature T82 of the second control point has reached the atmosphere opening temperature (S4).

When the temperature T82 of the second control point reaches the atmosphere opening temperature (Yes in S4), the control device 80 terminates the heating control for the refrigerator 31 (S8). That is, the control device 80 terminates a program for the room temperature return control.

Meanwhile, when the temperature T82 of the second control point does not reach the atmosphere opening temperature (No in S4), the control device 80 determines whether a time limit has been reached (S5). The time limit is a typical time at which the room temperature return control should be typically terminated after the room temperature return control is started (the time limit may be equal to or shorter than the time required for the room temperature return control). By monitoring the time limit, a fail-safe is applied when a problem occurs, e.g., when the temperature T82 of the second control point is not input to the control device 80.

When the time limit is reached (Yes in S5), the control device 80 terminates the heating control for the refrigerator 31 (S8). That is, the control device 80 terminates a program for the room temperature return control.

When the time limit has not been reached (No in S5), the control device 80 determines whether a notification of completion of return to room temperature has been received from the refrigerator 31 (S6). The refrigerator 31 monitors the temperature T33 of the first control point and the temperature T82 of the second control point separately from the control device 80, and when the temperature T82 of the second control point reaches the atmosphere opening temperature T2, the refrigerator 31 transmits that fact to the control device 80. Thus, a fail-safe is applied when a problem occurs, e.g., when the temperature T82 of the second control point is not input to the control device 80.

When the control device 80 receives the notification of completion of return to room temperature from the refrigerator 31 (Yes in S6), the control device 80 terminates the heating control for the refrigerator 31 (S8). That is, the control device 80 terminates a program for the room temperature return control.

When the control device 80 does not receive the notification of completion of return to room temperature from the refrigerator 31 (No in S6), the control device 80 determines whether an input of the termination of the room return control (program) has been received from a user interface (S7).

When there is no user operation for termination (No in S7), the processing returns to step S4, and the control device 80 repeats step S4 and subsequent steps.

Also, steps S4 to S7 may be determined in any order, and the shown order is an example.

When there is a user operation for termination (Yes in S7), the control device 80 terminates the heating control for the refrigerator 31 according to the user operation (S8). That is, the control device 80 terminates a program for the room temperature return control.

Main Effect

According to the substrate processing apparatus 100 according to the present disclosure, the control device 80 performs room temperature return control on the basis of the temperature T33 of the first control point, and thus it is possible to suppress the temperature T33 of the first control point from exceeding the target temperature T1. Also, the control device 80 performs the on and off control of the heating control such that the target temperature T1 is not exceeded, and thus it is possible to reduce temperature drift.

When the temperature T82 of the second control point has reached the atmosphere opening temperature, the control device 80 terminates the room temperature return control, and thus it is possible to complete the control within the time required for the room temperature return control. As a result, after a predetermined time, it is possible to open the vacuum processing container 10 of the substrate processing apparatus 100 to the atmosphere by opening the lid of the vacuum processing container 10.

Other Application Examples

The configuration and the like illustrated in the above embodiment may be combined with other components, and the present disclosure is not in any way limited to the configuration shown here. In this regard, changes can be made without departing from the spirit of the present disclosure and can be appropriately determined according to the application form.

For example, it has been described that the temperature control of the present embodiment is performed to return to room temperature during the maintenance work of the substrate processing apparatus, but the temperature control of the present embodiment can be executed even if the maintenance work is not a prerequisite. That is, maintenance may not be performed after returning to room temperature, and work other than maintenance may be performed.

Also, the target temperature T1 does not have to be equal to or higher than room temperature and may be a temperature suitable for the purpose of the work or the temperature control. For example, the target temperature T1 may be equal to or below 0 (zero) degrees. In this case, since the atmosphere opening temperature T2 does not refer to a temperature for opening to the atmosphere, the second target temperature may be appropriately set.

What is claimed is:

1. A substrate processing apparatus comprising:
   a mounting table configured to hold a substrate to be processed in a vacuum processing container;
   a heat transfer gas container placed on a back side of the mounting table with a gap between the mounting table and the heat transfer gas container, and the heat transfer gas container comprising a second temperature sensor;
   a refrigeration device cooling and heating the heat transfer gas container, the refrigeration device comprising a first temperature sensor and a refrigerator; and
   a control device configured to control an operation of the refrigerator,
   and the control device comprising a processor and a memory containing instructions therein, the instructions when executed by the processor cause the processor configured to:
   in response to receiving an input from the first temperature sensor, set a heating mode of the refrigerator included in the refrigeration device to be in an ON state;
   maintain the heating mode of the refrigerator in the ON state until a temperature detected by the first temperature sensor reaches a first temperature;
   when the temperature detected by the first temperature sensor reaches the first temperature, repeatedly switch the heating mode of the refrigerator between the ON state and an OFF state until a temperature detected by the second temperature sensor reaches a second temperature which is lower than the first temperature; and
   set and maintain the heating mode of the refrigerator to be in the OFF state when a temperature detected by the second temperature sensor reaches the second temperature.

2. The substrate processing apparatus of claim 1, wherein the instructions when executed by the processor cause the processor configured to:
   switch the heating mode of the refrigerator between the ON state and the OFF state repeatedly to maintain the temperature detected by the first temperature sensor within a range between the first temperature and the second temperature when the temperature detected by the first temperature sensor reaches the first temperature.

3. The substrate processing apparatus of claim 2, wherein the refrigerator includes an inverter, and
   wherein the instructions when executed by the processor further cause the processor configured to:
   drive the inverter of the refrigerator to maintain the temperature detected by the first temperature sensor within the range between the first temperature and the second temperature when the temperature detected by the first temperature sensor reaches the first temperature.

4. The substrate processing apparatus of claim 1, wherein the instructions when executed by the processor cause the processor configured to:
   when the temperature detected by the first temperature sensor reaches the first temperature, switch the heating mode of the refrigerator between the ON state and the OFF state repeatedly such that the temperature detected by the first temperature sensor does not exceed the first temperature.

5. The substrate processing apparatus of claim 1, wherein the instructions when executed by the processor further cause the processor configured to:
   set and maintain the heating mode of the refrigerator in the OFF state based on a determination that time elapsed since the heating mode of the refrigerator was set to the ON state reaches a predetermined time limit.

6. The substrate processing apparatus of claim 1, wherein the instructions when executed by the processor further cause the processor configured to:
   open a lid of the vacuum processing container based on a determination that the temperature detected by the second temperature sensor reaches the second temperature and the heating mode of the refrigerator is set and maintained to be in the OFF state.

7. The substrate processing apparatus of claim 1, wherein the refrigeration device further comprises a cold head part placed between the heat transfer gas container and the refrigerator and making contact with the heat transfer gas container and the refrigerator, and
   wherein the first temperature sensor is provided in an upper portion of the cold head part, and the second temperature sensor is provided in an upper portion of the heat transfer gas container.

* * * * *